United States Patent
Han et al.

(10) Patent No.: US 9,209,420 B2
(45) Date of Patent: Dec. 8, 2015

(54) DISPLAY DEVICE

(71) Applicant: SAMSUNG DISPLAY CO., LTD., Yongin, Gyeonggi-Do (KR)

(72) Inventors: So Yeon Han, Seoul (KR); Hak Sun Kim, Seoul (KR); Tae-Hyeog Jung, Hwaseong-si (KR); Kyu-Taek Lee, Cheonan-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/293,926

(22) Filed: Jun. 2, 2014

(65) Prior Publication Data

US 2015/0090969 A1     Apr. 2, 2015

(30) Foreign Application Priority Data

Sep. 27, 2013   (KR) .................. 10-2013-0115683

(51) Int. Cl.
| | | |
|---|---|---|
| *H01L 23/18* | (2006.01) | |
| *H01L 23/08* | (2006.01) | |
| *H01L 27/15* | (2006.01) | |
| *H01L 51/52* | (2006.01) | |
| *H01L 27/32* | (2006.01) | |

(52) U.S. Cl.
CPC .......... *H01L 51/524* (2013.01); *H01L 27/3244* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 2010/0112296 A1* | 5/2010 | Yoshihara et al. ............ | 428/172 |
| 2010/0177398 A1* | 7/2010 | Watanabe et al. ............ | 359/614 |
| 2012/0300306 A1* | 11/2012 | Nagahama et al. ........... | 359/601 |
| 2013/0177748 A1* | 7/2013 | Hirai et al. .................... | 428/203 |

FOREIGN PATENT DOCUMENTS

| | | |
|---|---|---|
| KR | 10-2010-0102921 | 9/2010 |
| KR | 10-1113661 | 2/2012 |

* cited by examiner

*Primary Examiner* — Joseph Schoenholtz
(74) *Attorney, Agent, or Firm* — F. Chau & Associates, LLC

(57) ABSTRACT

A display device according to an exemplary embodiment of the present invention includes a display panel. A protective window is formed on the display panel. The protective window includes a first transparent member. The first transparent member includes a plurality of protrusions. The first transparent member is made of an elastomer. A second transparent member is provided on the first transparent member. The second transparent member is made of a high-hardness polymer material. The second transparent member fills spaces between the plurality of protrusions and forms a flat surface.

20 Claims, 9 Drawing Sheets

DISPLAY DEVICE

CROSS-REFERENCE TO RELATED APPLICATION

This application claims priority to Korean Patent Application No. 10-2013-0115683 filed in the Korean Intellectual Property Office on Sep. 27, 2013, the disclosure of which is incorporated by reference herein in its entirety.

TECHNICAL FIELD

Exemplary embodiments of the present disclosure relates to displays, and more specifically, to flexible display devices.

DISCUSSION OF THE RELATED ART

A display device may include a display panel for displaying an image and a protective window provided on the optical unit to protect the display panel.

When the protective window is made of a high-hardness material, the display device cannot be easily bent and thus the protective window may be broken or crack. In other words, the flexibility of the display device is decreased.

However, when the flexibility of the window is increased, the surface hardness of the window may be decreased.

SUMMARY

A display device according to an exemplary embodiment of the present invention includes a display panel. The display device may be a flexible display device. The display panel may be a flexible display panel. A protective window is formed on the display panel. The protective window includes a first transparent member and a second transparent member. The first transparent member includes a plurality of protrusions. The first transparent member is made of an elastomer. The second transparent member is provided on the first transparent member. The second transparent member is made of a high-hardness polymer material. The second transparent member fills spaces between the plurality of protrusions and forms a flat surface.

The elastomer may include urethane or silicon, and the polymer material may include poly-silsesquioxane or high-hardness poly-methyl methacrylate.

The flexible display panel may be an organic light emitting diode (OLED) display.

The protective window may have a thickness of less than about 400 μm.

The plurality of protrusions may be spaced apart from each other at a predetermined distance. The plurality of protrusions may have substantially the same shape.

The plurality of protrusions may be formed over an entire area of the first transparent member.

A display device according to an exemplary embodiment of the present invention includes a display panel. The display device may be a flexible display device. The display panel may be a flexible display panel. A protective window is formed on the display panel. The protective window includes a transparent member and a filling member. The transparent member includes a recessed portion. The filling member fills the recessed portion. The filling member is made of an elastomer.

The elastomer may include urethane or silicon, and the polymer material may include poly-silsesquioxane or high-hardness poly-methyl methacrylate.

The recessed portion may be provided at a middle portion of the flexible display panel.

The recessed portion may include a plurality of small recessed portions.

Cross-sections of the plurality of small recessed portions may have substantially the same size and substantially the same shape. The plurality of small recessed portions may be separated from each other at a predetermined distance.

The transparent member may include a first area and second areas provided at sides of the first area. The recessed portion may be provided in the first area.

Depths of the plurality of small recessed portions may be gradually increased or decreased toward edges adjacent to the second areas from the middle portion of the first area.

Distances between the plurality of small recessed portions may be gradually increased or decreased toward edges adjacent to the second areas from the middle portion of the first area.

The thickness of the protective window may be less than about 400 μm.

The transparent member may include a top surface and a bottom surface. The recessed portion may be formed in at least one of the top surface or the bottom surface.

The depth of a cross-section of the recessed portion may be gradually increased or decreased away from the middle portion of the recessed portion.

The cross-section of the recessed portion may be symmetrical with respect to an imaginary vertical middle portion line that is perpendicular to the top surface of the transparent member.

According to an exemplary embodiment of the present invention, a display device comprises a display panel. A protective window is formed on the display panel. The protective window includes a flexible layer. The flexible layer includes at least one protrusion on a surface thereof. The flexible layer may be an elastomer. A rigid layer (e.g., a high-hardness polymer) is formed on the flexible layer, covering the protrusion.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF EMBODIMENTS

Figure 1:
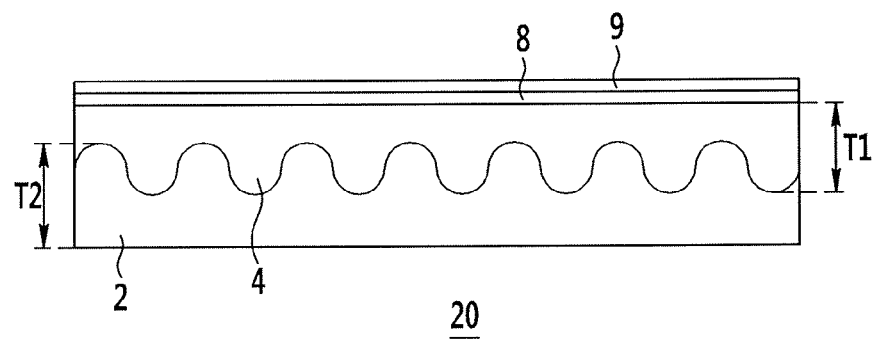
FIG. 1 is a cross-sectional view of a protective window according to an exemplary embodiment of the present invention.

Exemplary embodiments of the present invention are described with reference to the accompanying drawings. Like reference numerals may designate like or similar elements throughout the specification and the drawings.

It will be understood that when an element such as a layer, film, region, or substrate is referred to as being "on," "connected to," "coupled to," or "adjacent to" another element, it can be directly on, connected, coupled, or adjacent to the other element or intervening elements may also be present. As used herein, the singular forms "a," "an," and "the" are intended to include the plural forms as well, unless the context clearly indicates otherwise.

As used herein, the singular forms "a," "an," and "the" are intended to include the plural forms as well, unless the context clearly indicates otherwise.

FIG. 1 is a cross-sectional view of a protective window according to an exemplary embodiment of the present invention.

As shown in FIG. 1, the protective window 20 includes a first transparent member 2 and a second transparent member 4 formed on the first transparent member 2.

The first transparent member 2 is made of an elastomer, such as, for example, urethane or silicone, and the second transparent member 4 is made of a high-hardness polymer material, such as, for example, poly-silsesquioxane or polymethyl methacrylate.

The first transparent member 2 includes a plurality of protrusions, which are formed on an entire surface of the first transparent member 2. The plurality of protrusions of the first transparent member 2 are spaced apart from each other at a predetermined distance. The protrusions of the first transparent member 2 may be formed through an imprinting process.

The second transparent member 4 fills spaces between the protrusions and forms a flat surface.

Alternatively, the second transparent member 4 may include a plurality of protrusions, and the first transparent member may fill the spaces between the protrusions and form a flat surface.

The first transparent member 2 and the second transparent member 4, respectively, may have thicknesses T1 and T2. T1 and T2 each may be in a range from about 100 µm to about 200 µm. When each of the thickness of the first transparent member 2 and the thickness of the second transparent member 4 is smaller than about 100 µm, the protective window 20 might not have a sufficient strength and hardness. When each of the thicknesses of the first and second transparent members 2 and 4 are greater than about 200 µm, the rigidity of the protective window 20 may be increased, thus decreasing the flexibility of the protective window 20.

According to an exemplary embodiment of the present invention, the first transparent member 2 of the protective window 20 is attached to a display panel. The second transparent member 4 has high hardness and is exposed to the outside. Accordingly, the protective window 20 is resistant to external scratches. Even when the protective window 20 is attached to a flexible display device and is bent, compression stress is dispersed by the flexible first transparent member 2, thus preventing the second transparent member 4 from cracking.

The high-hardness second transparent member 4 may be rendered to have flexibility by have its thickness be in a range from about 100 µm to about 200 µm. When the second transparent member 4 is bent, the first transparent member 2 may support the second transparent member 4, thus preventing the second transparent member 4 from cracking.

A hard coating layer 8 and a functioning layer 9 may be provided on the protective window 20. Alternatively, the hard coating layer 8 and the functioning layer 9 may be omitted.

The hard coating layer 8 is made of an organic-inorganic complex material. The hard coating layer 8 can increase surface strength without reducing flexibility of the protective window 20. The thickness of the hard coating layer 8 may be in a range from about 10 µm to about 60 µm. For example, the hard coating layer 8 may have a thickness that ranges from about 20 µm to about 25 µm.

The functional layer 9 may be formed of an anti-fingerprint layer including a silicon oxide layer and a fluorine compound, and the silicon oxide layer and the fluorine compound may respectively have thicknesses of about 850 Å and about 300 Å.

The protective window 20 includes the first transparent member 2 made of the elastomer and the second transparent member 4 made of the high-hardness polymer material. Accordingly, the display device including the protective window 20 can be easily bent with no cracks generated in the bent portion of the protective window 20.

Although a flexible display device including the protective window 20 is repeatedly bent, the first transparent member 2 having relatively high tensile strength supports the second transparent member 4, and thus, the first transparent member 2 can be prevented from being damaged due to compression stress.

The second transparent member 4 fills spaces between the protrusions of the first transparent member 2 and thus the thickness of portions of the second transparent member 4 varies. For example, the second transparent member 4 is rendered to have relatively thin portions and relatively thick portions due to the plurality of protrusions, and thus the compression stress is reduced despite repeatedly bending a display device including the protective window 20, and thus, the display device can be easily bent.

The size of each of the protrusions and spaces between the protrusions can be adjusted according to the curvature of the display device bent and the hardness of the protective window 20.

The surface hardness of the protective window 20 can be increased by the second transparent member 4, and the flexibility of the protective window 20 can be increased by the first transparent member 2. Thus, the protective window 20 can be prevented from being damaged when a flexible display device including the protective window 20 is repeatedly bent.

FIG. 2 to FIG. 12 are cross-sectional views of protective windows according to exemplary embodiments of the present invention.

As shown in FIG. 2 to FIG. 12, a protective window 22 according to an exemplary embodiment of the present invention includes a transparent member 6 and a filling member 7. The transparent member 6 may be made of substantially the same material as the second transparent member 4 of FIG. 1, and the filling member 7 may be made of substantially the same material of the first transparent member 2 of FIG. 1.

Figure 2:
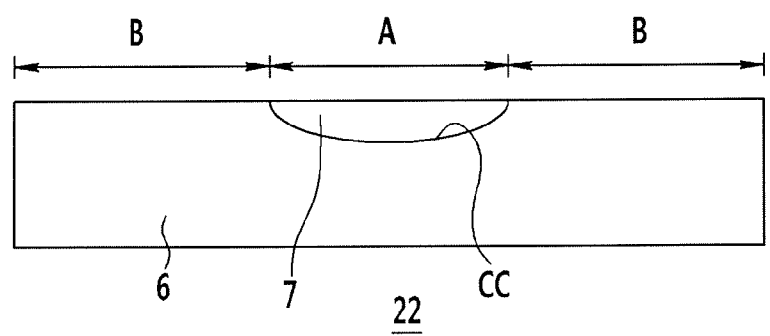
FIG. 2 to FIG. 12 are cross-sectional views of protective windows according to exemplary embodiments of the present invention.
Figure 3:
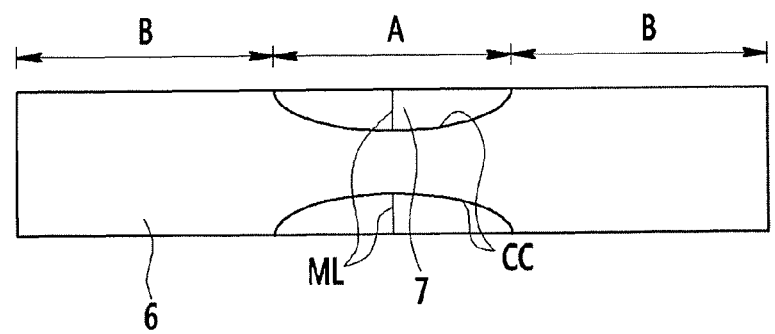

The transparent member 6 has a recessed portion CC, and as shown in FIG. 2, the recessed portion CC may be opened to an upper side of the transparent member 6. Alternatively, the transparent member 6 may have a recessed portion that is opened to a lower side thereof. As shown in FIGS. 3 to 12, the transparent member 6 may have recessed portions CC that are respectively opened to both the upper side and the lower side of the transparent member 6.

As shown in FIG. 3 to FIG. 12, a cross-section of the recessed portion CC may be shaped like a semicircle, a half ellipse, or a polygon such as a triangle or a quadrangle, and may be symmetrical with respect to an imaginary vertical middle portion line ML that is perpendicular to an upper surface of the transparent member 6. Although the imaginary vertical middle portion line ML is only shown for the recessed portions CC of FIG. 3, it is applicable to the each of the recessed portions of the embodiments shown in FIGS. 4-12.

Figure 4:
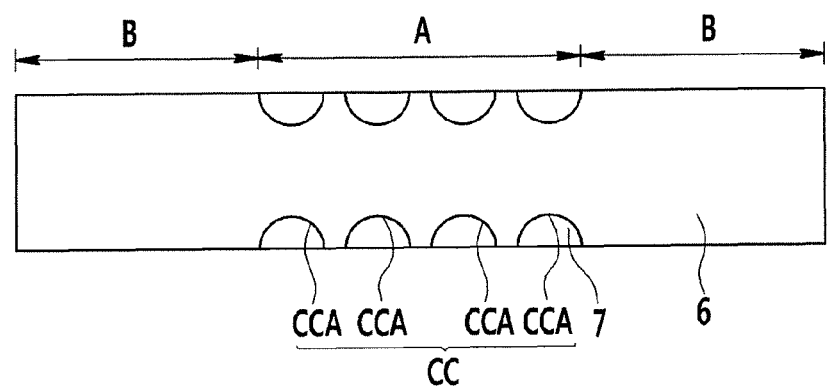
Figure 5:
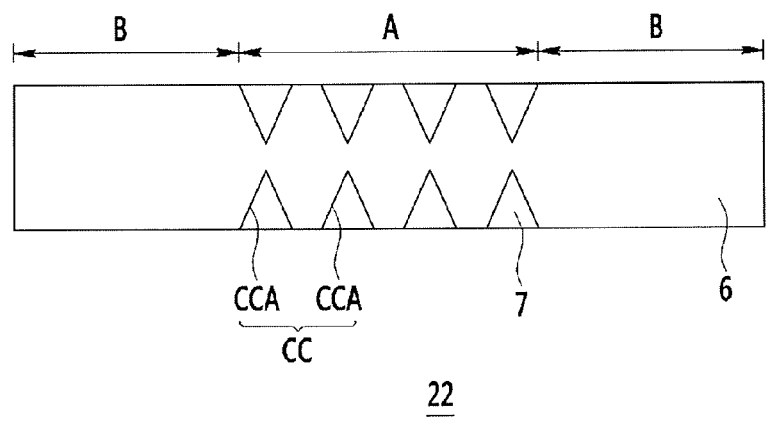
Figure 6:
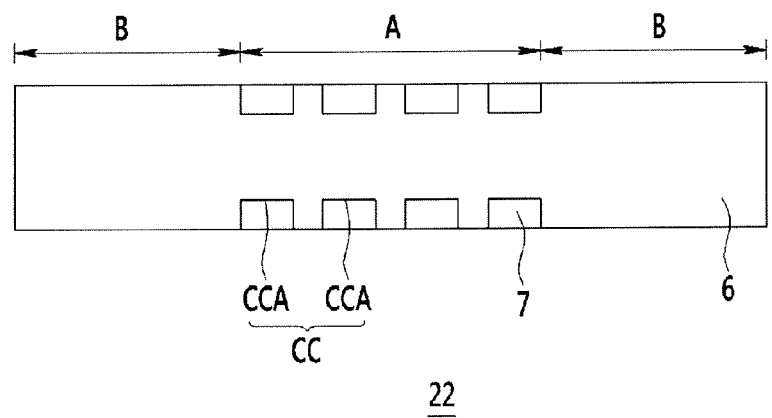

As shown in FIG. 4 to FIG. 9 and FIG. 12, the recessed portion CC may include a plurality of small recessed portions CCA, and the plurality of small recessed portions CCA may be spaced apart from each other at a constant distance, and the plurality of small recessed portions CCA may have substantially the same size as shown in FIG. 4 to FIG. 6.

Figure 8:
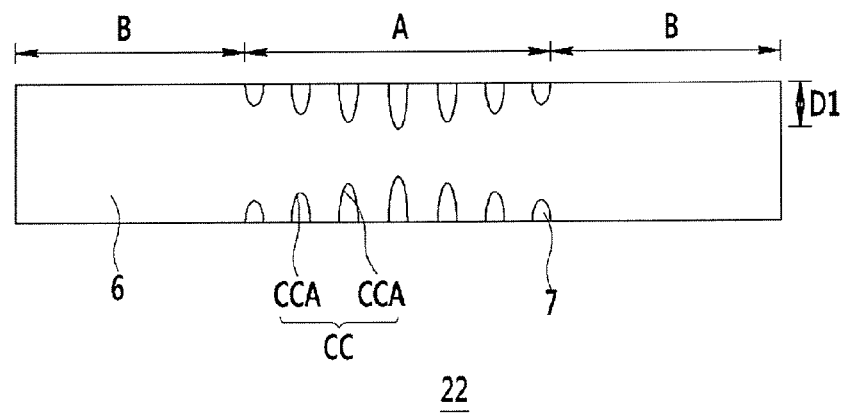
Figure 9:
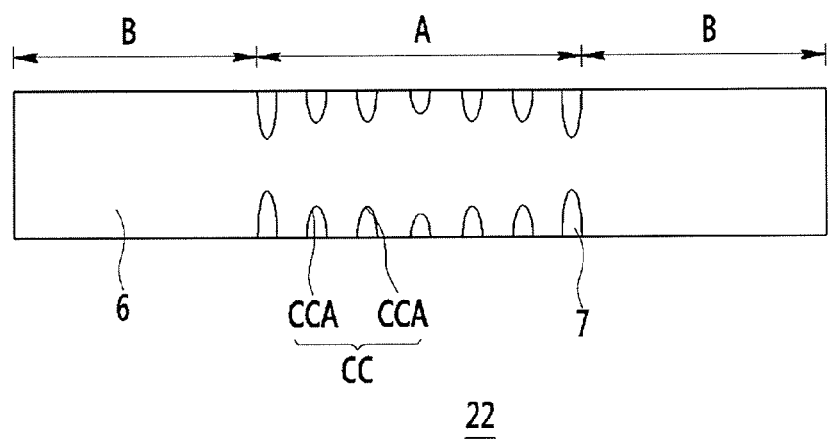
Figure 12:
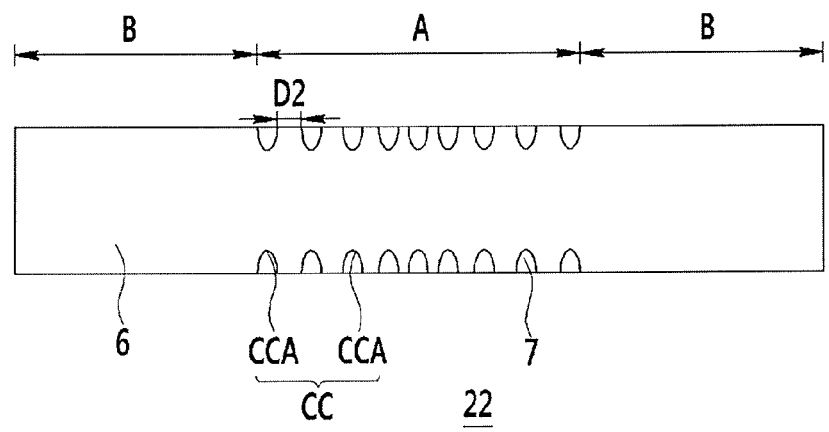

As shown in FIG. 8 and FIG. 9, the depth D1 of the small recessed portions CCA may be gradually increased or decreased from the middle portion of a first area A of the protective window 22 to an edge that is adjacent to a second area B. As shown in FIG. 12, the distance D2 between the small recessed portions CCA may be gradually increased or decreased (not shown) from a middle portion area A of the protective window 22 to an edge that is adjacent to second areas B.

Figure 10:
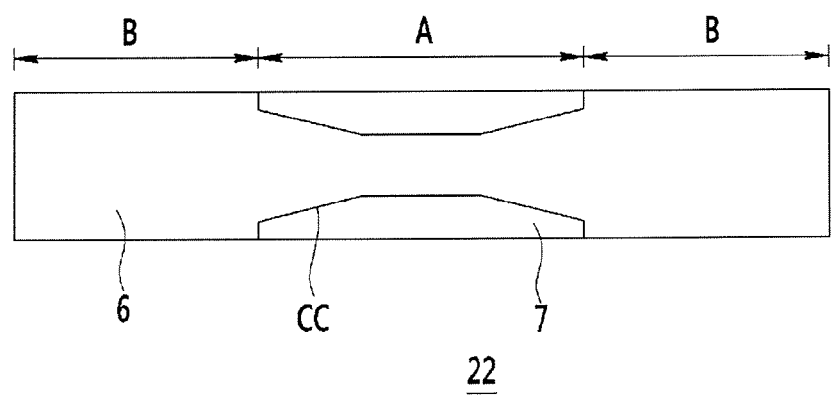
Figure 11:
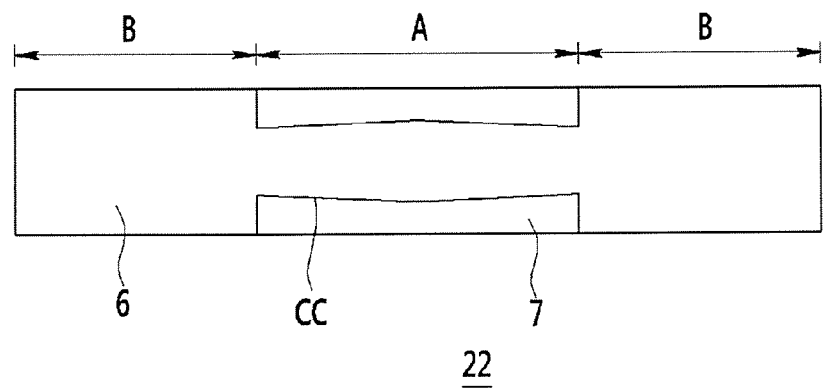

The depth of one recessed portion CC may be increased or decreased from a middle portion of the recessed portion CC to an edge thereof as shown in FIG. 10 and FIG. 11.

Figure 7:
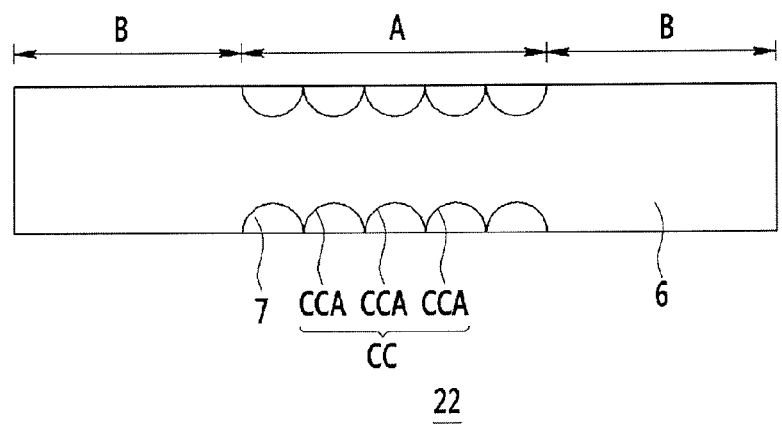

As shown in FIG. 7, the small recessed portions CCA may be connected with each other.

The protective window 22 includes the first area A and the second areas B located at respective sides of the first area A, and the recessed portion CC may be provided in the first area A.

The first area A may be a bent portion where the protective window 22 is bent, or may be substantially a middle portion of the display device including the protective window 22. The first area A has substantially the same area of one of the second areas B in the drawings, but the first area A may be larger or smaller than the second area B. In this case, the first area A may have a width of less than about 16 mm.

In FIG. 3 to FIG. 12, the first area A is located at the middle of the protective window 22. Alternatively, the first area A and the second area B may be alternately and repeatedly located according to the shape and a degree of bending of a display device including the protective window 22.

According to an exemplary embodiment of the present invention, the protective window 20 is formed of an elastomer and a high-hardness polymer material, and accordingly, a display device including the protective window 20 can be easily bent, thus preventing the protective window 20 from cracking in the bent portion.

Since the transparent member 6 in the first area A is relatively smaller in volume than the transparent member 6 in the second area B due to the recessed portion CC, the protection window 22 can be easily bent. When an elastomer having relatively high elasticity forms the filling member 7 in the recessed portion of the transparent member 6 and then the protective window 22 is bent, the filling member 7 may support the transparent member 6, preventing the transparent member 6 from being damaged by the compression stress.

According to an exemplary embodiment of the present invention, the size, the shape, and the distance between the recessed portion and the small recessed portions can be varied depending on the compression stress applied to the transparent member 6 of the first area A and a curvature of a display device to be formed, and thus the compression stress applied to the transparent member 6 can be minimized.

The surface hardness of the protective window can be increased by the transparent member 6 and flexibility of the protective window is increased by the filling member 7. Therefore, the protective window 22 can be prevented from being damaged when the flexible display device is repeatedly bent.

Figure 13:
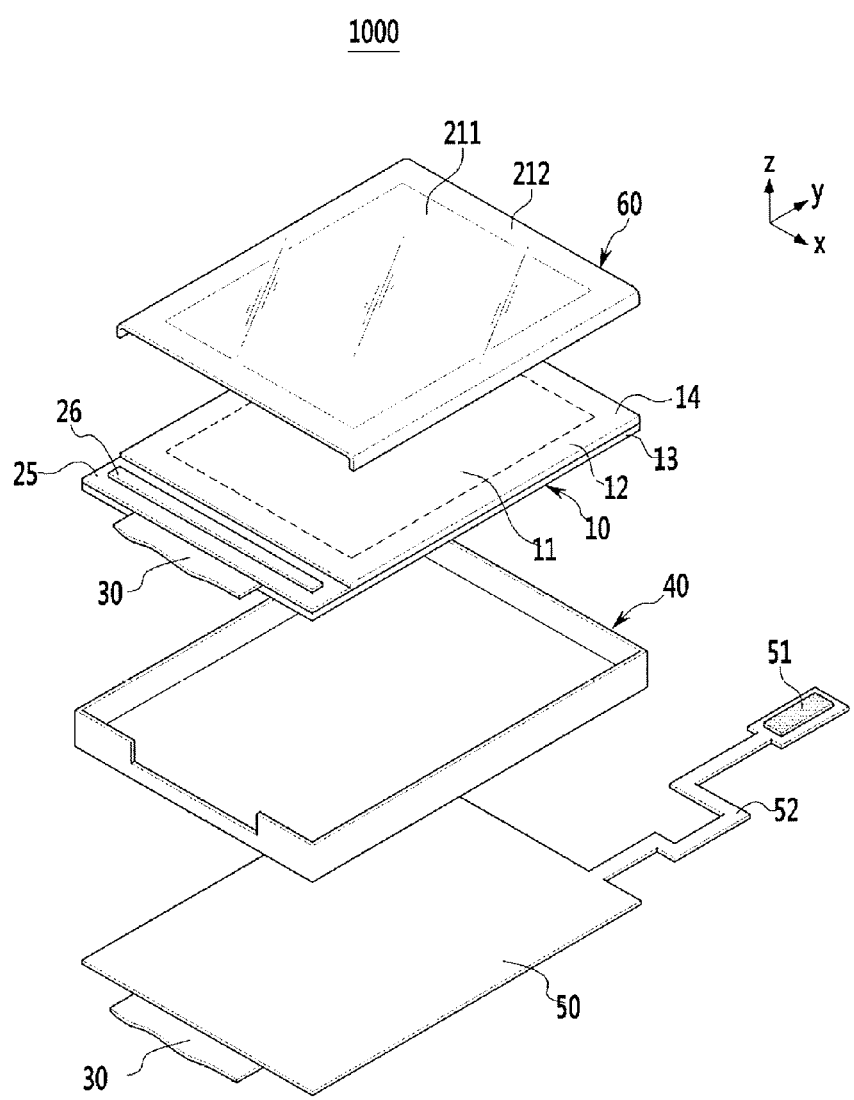
FIG. 13 is a perspective view of a flexible display device according to an exemplary embodiment of the present invention.

FIG. 13 is a perspective view of a flexible display device according to an exemplary embodiment of the present invention.

As shown in FIG. 13, a display device 1000 according to an exemplary embodiment includes a display panel 10 for displaying an image, a housing 40 for receiving the display panel 10 and various parts, and a protective window 60 provided in front of the display panel 10 to protect the display panel 10.

The display panel 10 may be an organic light emitting display panel. Alternatively, the display panel 10 may be, for example, a liquid crystal display panel. However, the present invention is not limited thereto.

The display panel 10 is electrically connected to a printed circuit board (PCB) 50 through a flexible printed circuit 30.

Pixels are arranged in a matrix form on a first substrate 13, and a second substrate 14 is bonded to the first substrate 13 through a sealing member (not shown), protecting the pixels. In this case, the first substrate 13 may be a rear substrate and the second substrate 14 may be a front substrate.

Signal lines for applying signal to the pixels of the display panel 10 are connected to the printed circuit board 50 through the flexible printed circuit 30. When signals are input to an input terminal and a control terminal from the printed circuit board 50, a thin film transistor of each pixel is turned on/off according to its corresponding signal and outputs an electrical signal for pixel driving to an output terminal of the thin film transistor.

A driving circuit 26 is formed on the first substrate 13 and generates a timing signal for application of a driving signal transmitted from the printed circuit board 50 to a gate line and a data line. The driving circuit 26 may be formed as an IC (Integrated Circuit) chip and be mounted on the first substrate 13, or may be integrated with the pixel circuit on the substrate 13.

The printed circuit board 50 includes electronic elements (not shown) for processing the driving signal, and a connector 51 which receives an external signal and transmits the external signal to the electronic elements of the printed circuit board 50 through an extension portion 52.

The protective window 60 is provided on the display panel 10. The protective window 60 protect the display panel 10 from being damaged by an external impact, and the protective window may include one of the protective windows 20 and 22 described above in connection with FIG. 1 to FIG. 12. According to an exemplary embodiment of the present invention, the thickness of the protective window 60 may be less than about 400 μm.

The display panel 10 and the protective window 60 may be attached to each other by an adhesive layer (not shown).

The protective window 60 includes a transparent portion 211 and an opaque portion 212. The transparent portion 211 corresponds to a display area 11 where pixels of the display panel 10 are disposed and display an image, and the opaque portion 212 surrounds the transparent portion 211 and corresponds to a non-display area 12 where the driving circuits are disposed and no image is displayed. The opaque portion 212 stops the driving circuit or wires from being viewed from the outside. The opaque portion 212 may include a product logo or a decorative pattern.

The protective window 60 includes a first flat surface corresponding to the display area 11 of the display panel 10 and a second flat surface corresponding to a side surface of the display panel 10. The protective window 60 may include a curved surface bent with a constant curvature and surrounds corners of the display panel 10. The curved surface of the protective window 60 connects the first flat surface and the second flat surface.

As shown in FIG. 13, curved surfaces are located at respective sides of the first flat surface. Alternatively, a curved surface may be formed at only one of the sides of the first flat surface.

According to an exemplary embodiment of the present invention, a touch panel may be provided between the protective window 60 and the display panel 10. The touch panel may be of an electrostatic capacitive type or a pressure sensitive type, and may sense a user's touch on the OLED display.

Figure 14:
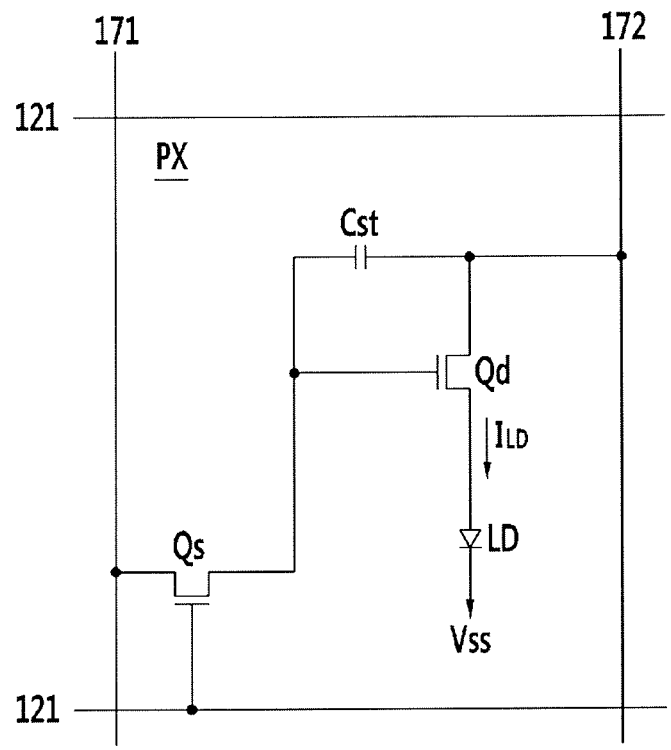
FIG. 14 is an equivalent circuit diagram of one pixel of an organic light emitting diode (OLED) display according to an exemplary embodiment of the present invention.

FIG. 14 is an equivalent circuit diagram of one pixel of an OLED display according to an exemplary embodiment of the present invention.

As shown in FIG. 14, an OLED display according to an exemplary embodiment of the present invention includes a plurality of signal lines 121, 171, and 172, and a pixel PX connected to the signal lines 121, 171, and 172.

The signal lines 121, 171, and 172 include scanning signal lines 121 for transmitting a gate signal (or a scan signal) to the pixel PX, a data line 171 for transmitting a data signal to the pixel PX, and a driving voltage line 172 for transmitting a driving voltage to the pixel PX. The gate lines 121 are extended substantially in parallel with each other in a row direction, and the data line 171 is extended substantially in a column direction. Although the driving voltage line 172 is extended substantially in the column direction, exemplary embodiments of the present invention are not limited thereto. Alternatively, the driving voltage line 172 may be extended substantially in the row direction or may be formed in a mesh shape with other driving voltage lines.

The pixel PX includes a switching transistor (Qs), a driving transistor (Qd), a storage capacitor Cst, and an organic light emitting element LD.

The switching transistor Qs includes a control terminal connected to a gate line 121, an input terminal connected to the data line 171, and an output terminal connected to the driving transistor Qd. The switching transistor Qs transmits a data signal received from the data line 171 to the driving transistor Qd in response to a scan signal received from the gate line 121.

The driving transistor Qd includes a control terminal connected to the switching transistor Qs, an input terminal connected to the driving voltage line 172, and an output terminal connected to the organic light emitting element LD. Through the driving transistor Qd, an output current ILD flows which has a magnitude that varies according to a voltage applied between the control terminal and the output terminal.

The capacitor Cst is connected between the control terminal and the input terminal of the driving transistor Qd. The capacitor Cst charges a data signal applied to the control terminal of the driving transistor Qd and maintains the charge even after the switching transistor Qs is turned off.

The organic light emitting element LD, for example, an organic light emitting diode (OLED), includes an anode connected to the output terminal of the driving transistor Qd and a cathode connected to a common voltage Vss. The organic light emitting element LD emits light whose intensity varies according to the output current ILD of the driving transistor Qd, displaying an image. The organic light emitting element LD may include an organic material which expresses one or more primary colors such as red, green, and blue, and the organic light emitting diode display displays an image by a spatial sum of the colors.

The switching transistor Qs and the driving transistor Qd may be n-channel field effect transistors (FET), or at least one thereof may be a p-channel field effect transistor. Further, the connections of the transistors Qs and Qd, the storage capacitor Cst, and the organic light emitting element LD may be changed.

Figure 15:
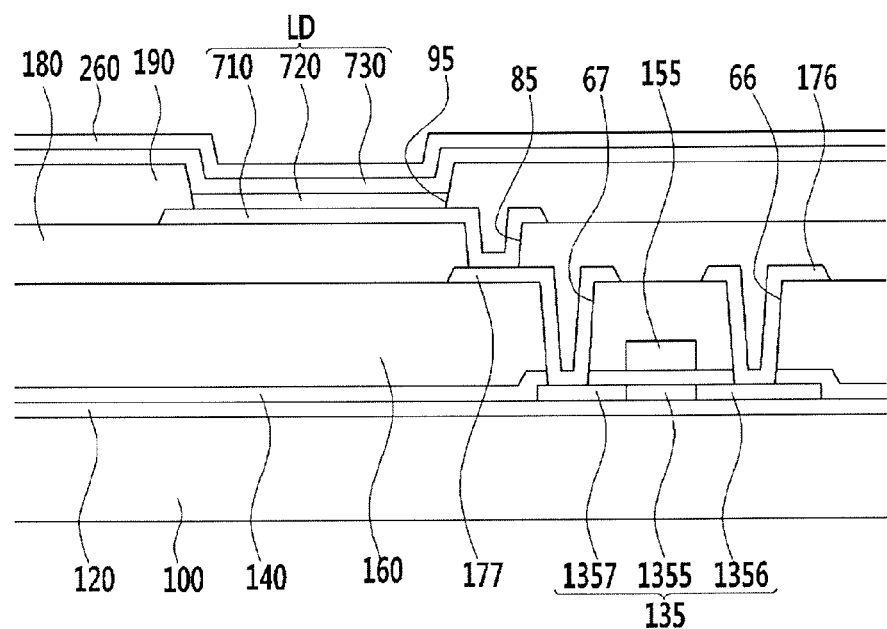
FIG. 15 is a cross-sectional view of one pixel of an OLED display according to an exemplary embodiment of the present invention.

FIG. 15 is a cross-sectional view of one pixel of an OLED display according to an exemplary embodiment of the present invention.

The driving thin film transistor Qd may be simply referred to as a thin film transistor.

As shown in FIG. 15, the OLED display includes a substrate 100, and a buffer layer 120 is formed on the substrate 100.

The substrate 100 may be the first substrate 13 of FIG. 13, and is a flexible substrate and may be formed of an organic material, such as polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), or cellulose acetate propionate (CAP) that is an insulating organic material.

The buffer layer 12 may be a single layer of silicon nitride (SiNx) or a double-layered structure in which a silicon nitride (SiNx) layer and a silicon oxide (SiO$_x$) layer are laminated. The buffer layer 120 may planarize a surface and prevent permeation of, e.g., an impurity or moisture.

A semiconductor 135 is formed of polysilicon on the buffer layer 120.

The semiconductor 135 includes a channel area 1355, a source area 1356, and a drain area 1357. The source area 1356 and the drain area 1357 are respectively formed at opposite sides of the channel area 1355. The channel area 1355 of the semiconductor 135 includes polysilicon doped with no impurity. For example, the channel area 1355 includes an intrinsic semiconductor. The source area 1356 and the drain area 1357 include polysilicon doped with a conductive impurity. For example, the source area 1356 and the drain area 1357 include an impurity semiconductor. The impurity doped in the source area 1356 and the drain area 1357 may be a p-type impurity and an n-type impurity.

A gate insulating layer 140 is formed on the semiconductor 135. The gate insulating layer 140 may be a single layer or may have a multilayered structure including at least one of tetraethyl orthosilicate (TEOS), a silicon nitride, and a silicon oxide.

A gate electrode 155 is formed on the semiconductor 135, and the gate electrode 155 overlaps the channel area 1355.

The gate electrode 155 may be formed of a single layer or a plurality of layers of a low resistance material such as Al, Ti, Mo, Cu, Ni, or an alloy thereof, or a high corrosion-resistant material.

A first interlayer insulating layer 160 is formed on the gate electrode 155. The first interlayer insulating layer 160 may be formed of a single layer or a plurality of layers of at least one of tetraethyl orthosilicate (TEOS), a silicon nitride, and a silicon oxide.

The first interlayer insulating layer 160 and the gate insulating layer 140 have a source contact hole 66 and a drain contact hole 67 through which the source region 1356 and the drain region 1357, respectively, are exposed.

A source electrode 176 and a drain electrode 177 are formed on the first interlayer insulating layer 160. The source electrode 176 is connected with the source area 1356 through the source contact hole 66, and the drain electrode 177 is connected with the drain area 1357 through the drain contact hole 67.

The source electrode 176 and the drain electrode 177 may be formed of a single layer or a plurality of layers of a low resistance material such as Al, Ti, Mo, Cu, Ni, or an alloy thereof, or a high corrosion-resistant material. For example, the source electrode 176 and the drain electrode 177 may have a triple-layered structure of Ti/Cu/Ti, Ti/Ag/Ti, or Mo/Al/Mo.

The gate electrode 155, the source electrode 176, and the drain electrode 177, together with the semiconductor 135, form a thin film transistor. A channel of the thin film transistor is formed in the semiconductor 135 between the source electrode 176 and the drain electrode 177.

A second interlayer insulating layer 180 is formed on the source electrode 176 and the drain electrode 177. The second interlayer insulating layer 180 includes a contact hole 85 exposing the drain electrode 177.

The second interlayer insulating layer 180 may be formed of a single layer or a plurality of layers of tetraethyl orthosilicate (TEOS), a silicon nitride, or a silicon oxide, and may be formed of a low permittivity organic material.

A first electrode 710 is formed on the second interlayer insulating layer 180. The first electrode 710 is electrically connected with the drain electrode 177 through the contact hole 85, and the first electrode 710 may be the anode of the organic light emitting element of FIG. 14.

A pixel defining layer 190 is formed on the first electrode 710.

The pixel defining layer 190 includes an opening 95 that exposes the first electrode 710. The pixel defining layer 190 may include resins such as polyacrylates or polyimides, and silica-based inorganic materials.

An organic emission layer 720 is formed in the opening 95 of the pixel defining layer 190.

The organic emission layer 720 is formed of multiple layers including one or more of a light emitting layer, a hole injection layer (HIL), a hole transporting layer (HTL), an electron transporting layer (ETL), and an electron injection layer (EIL).

When the organic emission layer 720 includes all of the layers HIL, HTL, ETL, and EIL, the hole injection layer (HIL) is disposed on a pixel electrode which is an anode, and the hole transporting layer (HTL), the light emitting layer, the electron transporting layer (ETL), and the electron injection layer (EIL) are sequentially laminated on the hole injection layer (HIL).

A second electrode 730 is formed on the pixel defining layer 190 and the organic emission layer 720.

The second electrode 730 is a cathode of the organic light emitting element LD. Thus, the first electrode 710, the organic emission layer 720, and the second electrode 730 form the organic light emitting element LD.

The OLED display may be formed in any one of a front display type, a rear display type, and a one panel dual display type, depending upon the light-emitting direction of the organic light emitting element LD.

When the OLED display is formed in the front display type, the first electrode 710 has a reflective film and the second electrode 730 has a semitransparent or transparent film. When the OLED display is formed in the rear display type, the first electrode 710 has a semitransparent film and the second electrode 730 has a reflective film. When the OLED display is formed in a dual display type, the first electrode 710 and the second electrode 730 has a transparent or semitransparent film.

The reflective film and the semitransparent film are formed of at least one metallic material including magnesium (Mg), silver (Ag), gold (Au), calcium (Ca), lithium (Li), chromium (Cr), aluminum (Al), or alloys thereof. Whether a film is a reflective film or a semitransparent film may be determined depending upon the thickness thereof. As the thickness of the semitransparent film is decreased, the light transmittance of the semitransparent film may be increased, and the electric resistance of the semitransparent film may be increased.

The transparent film is made of a material such as indium tin oxide (ITO), indium zinc oxide (IZO), zinc oxide (ZnO), and indium oxide ($In_2O_3$).

An encapsulation member 260 is formed on the second electrode 730, and the second substrate 14 of FIG. 13 may be omitted because the encapsulation member 260 is formed.

The encapsulation member 260 may include at least one organic layer and inorganic layer, and the organic layer and the inorganic layer may be alternately and repeatedly formed.

The organic layer is formed of a polymer, and may be a single layer or a stacked layer including any one of, for example, polyethylene terephthalate, polyimide, polycarbonate, epoxy, polyethylene, and polyacrylate. For example, the organic layer may be formed of polyacrylate, and for example, the organic layer includes a material produced by polymerizing a monomer component including a diacrylate-based monomer and a triacrylate-based monomer. A monoacrylate-based monomer may be further included in the monomer component. Further, a photoinitiator, such as TPO, may be further included in the monomer component, but exemplary embodiments of the present invention are not limited thereto.

The inorganic layer may have a single-layered or multilayered structure containing a metal oxide or a metal nitride. For example, the inorganic layer may contain any one of $SiN_x$, $Al_2O_3$, $SiO_2$, and $TiO_2$.

The uppermost layer of the encapsulation member 260 which is exposed to the outside may be an inorganic layer for preventing moisture from permeating into the light-emitting device.

A halogenated metal layer including LiF may be further provided between the second electrode 730 and the encapsulation member 260. The halogenated metal layer may prevent the display unit from being damaged when the first inorganic layer 720 is formed by a sputtering manner or a plasma deposition manner.

The organic layer may be narrower than the inorganic layer, and thus, the inorganic layer may cover a whole surface of the organic layer.

While this invention has been shown and described in connection with exemplary embodiments thereof, it is to be understood by one of ordinary skill in the art that various changes in form and detail may be made thereto without departing from the spirit and scope of the present invention.

What is claimed is:

1. A display device, comprising:
   a display panel; and
   a protective window on the display panel, the protective window including
   a transparent member including a recessed portion and
   a filling member filling the recessed portion, wherein the filling member is formed of an elastomer,
   wherein the transparent member comprises a first area and second areas provided at sides of the first area, and
   wherein the recessed portion is provided in the first area, and the second areas have no recessed portions.

2. The display device of claim 1, wherein
   the elastomer includes urethane or silicone, and
   the transparent member includes poly-silsesquioxane or high-hardness poly-methyl methacrylate.

3. The display device of claim 1, wherein the recessed portion is provided at a middle portion of the display panel.

4. The display device of claim 1, wherein the recessed portion comprises a plurality of recessed portions.

5. The display device of claim 4,
wherein cross-sections of the plurality of small recessed portions have substantially the same size and substantially the same shape, and
wherein the plurality of recessed portions are separated from each other at a predetermined distance.

6. The display device of claim 4, wherein depths of the plurality of recessed portions are increased or decreased toward edges adjacent to the second areas from the middle portion of the first area.

7. The display device of claim 4, wherein distances between the plurality of recessed portions are increased or decreased toward edges adjacent to the second areas from the middle portion of the first area.

8. The display device of claim 1, wherein a thickness of the protective window is less than about 400 µm.

9. The display device of claim 1, wherein
the transparent member comprises a top surface and a bottom surface, and
the recessed portion is formed in at least one of the top surface or the bottom surface.

10. The display device of claim 1, wherein a depth of a cross-section of the recessed portion is increased or decreased away from the middle portion of the recessed portion.

11. The display device of claim 10, wherein the cross-section of the recessed portion is symmetrical with respect to an imaginary vertical middle portion line that is perpendicular to the top surface of the transparent member.

12. A display device, comprising:
a display panel; and
a protective window formed on the display panel, the protective window including:
a flexible layer including at least one protrusion on a surface thereof; and
a rigid layer formed on the flexible layer to cover the at least one protrusion,
wherein the rigid layer comprises a first area and second areas provided at sides of the first area, and
wherein the first area covers the at least one protrusion, and the second areas covers no protrusions.

13. The display device of claim 12, wherein
the flexible layer includes urethane or silicone, and
the rigid layer includes poly-silsesquioxane or high-hardness poly-methyl methacrylate.

14. The display device of claim 12, wherein the protrusion comprises a plurality of protrusions.

15. The display device of claim 14,
wherein cross-sections of the plurality of protrusions have substantially the same size and substantially the same shape, and
wherein the plurality of protrusions are separated from each other at a predetermined distance.

16. The display device of claim 14, wherein depths of the plurality of protrusions increase or decrease toward edges adjacent to the second areas from the middle portion of the first area.

17. The display device of claim 14, wherein distances between the plurality of protrusions increase or decrease toward edges adjacent to the second areas from the middle portion of the first area.

18. The display device of claim 12, wherein a thickness of the protective window is less than about 400 µm.

19. The display device of claim 12, wherein a depth of a cross-section of the protrusion increases or decreases away from the middle portion of the recessed portion.

20. The display device of claim 19, wherein the cross-section of the protrusions is symmetrical with respect to an imaginary vertical middle portion line that is perpendicular to the top surface of the rigid layer.

* * * * *